US012668877B2

(12) United States Patent
Malinen et al.

(10) Patent No.: US 12,668,877 B2
(45) Date of Patent: Jun. 30, 2026

(54) UNIFORM DEPOSITION

(71) Applicant: Picosun Oy, Espoo (FI)

(72) Inventors: Timo Malinen, Espoo (FI); Juhana Kostamo, Espoo (FI); Marko Pudas, Espoo (FI)

(73) Assignee: Picosun Oy, Espoo (FI)

( * ) Notice: Subject to any disclaimer, the term of this patent is extended or adjusted under 35 U.S.C. 154(b) by 151 days.

(21) Appl. No.: 16/603,635

(22) PCT Filed: Apr. 10, 2017

(86) PCT No.: PCT/FI2017/050254
§ 371 (c)(1),
(2) Date: Oct. 8, 2019

(87) PCT Pub. No.: WO2018/189413
PCT Pub. Date: Oct. 8, 2018

(65) Prior Publication Data
US 2021/0087687 A1     Mar. 25, 2021

(51) Int. Cl.
*C23C 16/455*     (2006.01)
*C23C 16/458*     (2006.01)
*C23C 16/52*     (2006.01)

(52) U.S. Cl.
CPC .. *C23C 16/45548* (2013.01); *C23C 16/45508* (2013.01); *C23C 16/458* (2013.01); *C23C 16/52* (2013.01)

(58) Field of Classification Search
None
See application file for complete search history.

(56) References Cited

U.S. PATENT DOCUMENTS

| | | | | |
|---|---|---|---|---|
| 4,058,430 | A | * | 11/1977 | Suntola ............. C23C 16/45525 |
| | | | | 148/DIG. 72 |
| 4,761,269 | A | * | 8/1988 | Conger ............. C23C 16/45561 |
| | | | | 118/679 |
| 5,770,469 | A | | 6/1998 | Uram et al. |
| 5,871,811 | A | | 2/1999 | Wang et al. |
| 6,045,617 | A | | 4/2000 | Keller |
| 6,428,847 | B1 | | 8/2002 | Grant et al. |

(Continued)

FOREIGN PATENT DOCUMENTS

| | | |
|---|---|---|
| AU | 2009-202611 A1 | 2/2012 |
| CN | 101465276 B | 7/2012 |

(Continued)

OTHER PUBLICATIONS

International Search Report and Written Opinion of the International Searching Authority issued in PCT Application No. PCT/FI2017/050254 on Dec. 29, 2017, 12 pages.

(Continued)

*Primary Examiner* — Karla A Moore
(74) *Attorney, Agent, or Firm* — Espatent Oy

(57) ABSTRACT

A reaction chamber of a substrate processing apparatus contains a reaction space. At least three lateral chemical inlets point towards a centre area of the reaction space each from different directions, each of the at least three lateral chemical inlets providing an individually closable route for a first precursor chemical to the reaction space.

27 Claims, 3 Drawing Sheets

100

(56) References Cited

U.S. PATENT DOCUMENTS

| | | | | |
|---|---|---|---|---|
| 6,734,020 | B2 * | 5/2004 | Lu | G05D 11/133 |
| | | | | 436/55 |
| 7,591,907 | B2 | 9/2009 | Chen | |
| 8,211,235 | B2 | 7/2012 | Lindfors et al. | |
| 9,127,360 | B2 | 9/2015 | Ramachandran et al. | |
| 9,353,440 | B2 | 5/2016 | Ge et al. | |
| 9,428,833 | B1 | 8/2016 | Duvall et al. | |
| 2003/0098372 | A1 * | 5/2003 | Kim | C23C 16/45565 |
| | | | | 239/548 |
| 2004/0026037 | A1 * | 2/2004 | Shinriki | C23C 16/45548 |
| | | | | 156/345.33 |
| 2004/0040543 | A1 * | 3/2004 | Mickelson | F02M 61/14 |
| | | | | 123/470 |
| 2004/0124131 | A1 | 7/2004 | Aitchison et al. | |
| 2005/0045100 | A1 * | 3/2005 | Derderian | C23C 16/4558 |
| | | | | 427/248.1 |
| 2005/0217582 | A1 | 10/2005 | Kim et al. | |
| 2005/0221004 | A1 * | 10/2005 | Kilpela | C23C 16/45544 |
| | | | | 427/248.1 |
| 2006/0196418 | A1 * | 9/2006 | Lindfors | C23C 16/45546 |
| | | | | 118/728 |
| 2008/0095953 | A1 | 4/2008 | Lee et al. | |
| 2008/0193643 | A1 | 8/2008 | Pip | |
| 2009/0260572 | A1 | 10/2009 | Kim et al. | |
| 2010/0055312 | A1 | 3/2010 | Kato et al. | |
| 2010/0116210 | A1 | 5/2010 | Kato et al. | |
| 2011/0223334 | A1 | 9/2011 | Yudovsky et al. | |
| 2012/0152171 | A1 | 6/2012 | Lee et al. | |
| 2013/0098455 | A1 | 4/2013 | Ng et al. | |
| 2013/0186337 | A1 | 7/2013 | Je et al. | |
| 2013/0210238 | A1 | 8/2013 | Yudovsky | |
| 2013/0252437 | A1 | 9/2013 | Sano et al. | |
| 2013/0267045 | A1 | 10/2013 | Lee et al. | |
| 2014/0137801 | A1 | 5/2014 | Lau et al. | |
| 2014/0174362 | A1 | 6/2014 | Kao et al. | |
| 2015/0110959 | A1 | 4/2015 | Ashizawa et al. | |
| 2015/0225848 | A1 | 8/2015 | Han et al. | |
| 2015/0368798 | A1 | 12/2015 | Kwong | |
| 2016/0002778 | A1 | 1/2016 | Ravi et al. | |
| 2016/0333478 | A1 | 11/2016 | Tatsuoka et al. | |

FOREIGN PATENT DOCUMENTS

| | | | | |
|---|---|---|---|---|
| CN | 103155104 | A | 6/2013 | |
| CN | 106463365 | A | 2/2017 | |
| JP | 2005-175242 | A | 6/2005 | |
| JP | 2009-170868 | A | 7/2009 | |
| JP | 2010114392 | A | 5/2010 | |
| KR | 20090118951 | A | 11/2009 | |
| SG | 194576 | A1 | 12/2013 | |
| WO | 2006/091405 | A3 | 8/2006 | |
| WO | 2014163742 | A1 | 10/2014 | |
| WO | 2014/179014 | A1 | 11/2014 | |
| WO | 2015/195256 | A1 | 12/2015 | |
| WO | 2015/195271 | A1 | 12/2015 | |
| WO | 2016/102748 | A1 | 6/2016 | |
| WO | WO-2017194059 | A1 * | 11/2017 | ......... C23C 16/4557 |
| WO | 2018/146370 | A1 | 8/2018 | |

OTHER PUBLICATIONS

European Patent Office, Extended European Search Report, Application No. 17905255.0, mailed Jan. 15, 2021, 8 pages.

The State Intellectual Property Office of People's Republic of China, The First Office Action, Application No. 2017800789178, Mailed Jun. 16, 2021, 5 pages.

The State Intellectual Property Office of People's Republic of China, Search Report, Application No. 201780089178, Mailed Jun. 7, 2021, 3 pages.

Korea Intellectual Property Office, Notification of Reason for Refusal, Application No. 10-2019-7032905, mailed Aug. 23, 2021, 69 pages, English Translation Attached, 8 pages.

* cited by examiner

Directly opposite and
partly opposite directions

100

| Substrate loading | 601 |

| Deposition with precursor in-feed from at least three directions | 602 |

| Substrate unloading | 603 |

UNIFORM DEPOSITION

FIELD

The aspects of the disclosed embodiments generally relate to substrate processing methods and apparatus, in particular to chemical deposition methods and deposition reactors. More particularly, but not exclusively, the aspects of the disclosed embodiments relate to uniform deposition by atomic layer deposition (ALD).

BACKGROUND

This section illustrates useful background information without admission of any technique described herein representative of the state of the art.

ALD is known as a conformal deposition method for various substrates, especially for silicon wafers. However, increasing the wafer size towards the 450 mm wafer size and the required low non-uniformity are setting challenges even for ALD. The challenge is more demanding for precursor chemicals, which have a limited deposition window, limited stability or reactive by-products.

US 20130210238 A1 presents an ALD method in which the uniformity of deposition is enhanced by rotating a holder carrying substrates. However, this may cause unnecessary generation of impurity particles, and requires costly tool design.

SUMMARY

The aspects of the disclosed embodiments are directed to provide a method and apparatus capable of producing ALD coatings with an improved uniformity, or at least to provide an alternative to existing technology.

According to a first example aspect of the disclosed embodiments there is provided a method, comprising:

providing a reaction chamber with a reaction space in a substrate processing apparatus; and providing at least three lateral precursor chemical inlets pointing towards a centre area of the reaction space each from different directions, each of the at least three lateral precursor chemical inlets providing an individually closable route for a first precursor chemical to the reaction space.

Accordingly, in certain example embodiments, the one and same precursor chemical is provided with inlets from at least three different lateral directions. In certain example embodiments, the lateral precursor chemical inlets are vertically positioned at a same level.

In certain example embodiments, the lateral precursor chemical inlets are at least partly lateral. A lateral precursor chemical inlet is at least partly lateral when its pointing direction has a lateral component. The pointing direction may be a horizontal direction or a direction having a non-zero angle with respect to the horizontal direction.

In certain example embodiments, three of the pointing directions of the at least three inlets are mutually partly opposite (or their lateral components are mutually partly opposite).

In certain example embodiments, each lateral precursor chemical inlet has its own in-feed tube and each in-feed tube its own pulsing valve. Accordingly, an individual in-feed tube provides the first precursor chemical to a respective inlet, and a pulsing valve is attached to each individual inlet. The pulsing valve, in certain example embodiments is a three-way valve. The first precursor chemical flows along an in-feed tube to a respective inlet. In certain example embodiments, the flow of the first precursor vapor to the respective inlet is opened and closed by the pulsing valve. In certain example embodiments, the pulsing valve is controlled by a control system. The pulsing valve in certain example embodiments, comprises two input ports and one output port. One of the input ports is in fluid communication with a precursor source container of the first precursor chemical. The other input port is in fluid communication with an inactive gas source. The control system controls, in certain example embodiments, which of the input ports is/are connected to the output port at each period of time. In certain example embodiments, during precursor chemical pulse periods of the first precursor chemical the control system controls, by operating the pulsing valves, that the first precursor chemical flows into the reaction space via selected lateral precursor chemical inlets only.

In certain example embodiments, the reaction space is of the general form of a cylinder. In certain example embodiments, the reaction space around a vertical centreline is virtually divided into three equal sectors, and at least one inlet of the first precursor chemical is placed in each of the sectors.

In certain example embodiments, the number of inlets providing a closable route for a first precursor chemical to the reaction space is four, five, six, seven, eight, or nine inlets. In certain example embodiments, the inlets are symmetrically placed with respect to the reaction space.

In certain example embodiments, at least three of the inlets are evenly distributed on a circumference symmetrically surrounding the centre area.

In certain example embodiments, the first precursor chemical is pulsed into the reaction space from one direction at a time. In certain example embodiments, the pulsing direction is changed during a pulse period or between consecutive pulse periods of the same precursor chemical (i.e., first precursor chemical). In certain example embodiments, the first precursor chemical is pulsed into the reaction space from two, three, four, or more directions at a time.

In certain example embodiments, a first precursor chemical enters the reaction space via only one inlet at a time. In certain example embodiments, the method comprises:

opening a route for the first precursor chemical from a first direction into the reaction space via a first lateral precursor chemical inlet so that the first precursor chemical flows via that inlet into the reaction space during a first period of time; and preventing the first precursor chemical from flowing into the reaction space via other inlets during that first period of time;

opening a route for the first precursor chemical from a second direction other than the first direction into the reaction space via a second lateral precursor chemical inlet so that the first precursor chemical flows via that inlet into the reaction space during a second period of time; and preventing the first precursor chemical from flowing into the reaction space via other inlets during that second period of time; and opening a route for the first precursor chemical from a third direction other than both the first and the second direction into the reaction space via a third lateral precursor chemical inlet so that the first precursor chemical flows via that inlet into the reaction space during a third period of time; and preventing the first precursor chemical from flowing into the reaction space via other inlets during that third period of time.

In certain example embodiments, when there are lateral precursor chemical inlets for the same precursor chemical in four directions, the corresponding opening and preventing step is performed similarly for the fourth direction. Similarly, if there are more than four lateral precursor chemical inlets for the same precursor chemical, the opening and closing steps are performed similarly for each direction as desired.

In certain example embodiments, the number of precursor chemicals is two. In certain example embodiments, the first precursor chemical (i.e., reactive chemical) is pulsed first from a plurality of directions where the directions may be two, three or more. The first precursor chemical is pulsed from one direction at a time or from a plurality of directions at a time. Then the second precursor chemical is pulsed. The second precursor chemical is pulsed from one direction or from a plurality of directions where the directions may be two, three or more. The second precursor chemical is pulsed from one direction at a time or from a plurality of directions at a time. In certain other embodiments, the second precursor chemical is pulsed immediately after the first precursor chemical has been pulsed from one direction, and the first precursor is pulsed immediately thereafter. The pulses may be optionally separated by a purge step. In yet other embodiments, a combination of the presented pulsing alternatives is performed.

In certain other embodiments, the number of precursor chemicals is one, for example, when applying photo-enhanced or plasma-enhanced processes. In certain other embodiments, the number of precursor chemicals is three or more.

The lateral precursor chemical inlets may radially point towards the centre area of the reaction space. The inlets of different chemicals may be positioned so that they alternate at a same vertical level, or they may be positioned at different heights, for example, so that the inlets of the second precursor chemical are above the inlets of the first precursor chemical.

In certain example embodiments, the method comprises carrying a substrate by a stationary substrate holder. In certain example embodiments, the method comprises carrying a plurality of substrates by the stationary substrate holder. The plurality of substrates may be horizontally oriented as a stack on top of each other, or horizontally oriented on a same level adjacent to each other, or vertically oriented in parallel to each other.

In certain example embodiments, the substrate is a planar, i.e., 2-dimensional (2D) object. In certain example embodiments, the substrate is a 3D object. In certain example embodiments, the substrate comprises a plurality of 2D and/or 3D objects.

In certain example embodiments, the method comprises:
carrying a substrate by a stationary substrate holder; and
providing the substrate with an effect comparable to rotating the substrate by opening and closing individual inlets in a predetermined manner.

In certain example embodiments, the method comprises:
providing an incoming flow of the first precursor chemical onto substrate surface from sides of the reaction chamber, and an outgoing flow downwards to exhaust after passing an edge of the substrate.

In certain example embodiments, the method comprises providing flow of the first precursor chemical from sides of the reaction chamber, along the substrate surface, and turning downwards towards exhaust when having passed an edge of the substrate.

In certain example embodiments, the lateral precursor chemical inlets are positioned on a level above the (highest) substrate holding level of the substrate holder. When there are a plurality of horizontally oriented substrates at different levels (heights), in certain example embodiments there are provided lateral precursor chemical inlets of the first precursor chemical on both a level above the highest substrate holding level and a level below the highest highest substrate holding level.

In certain example embodiments, the method comprises:
heating at least one chemical that flows into the reaction space.

In certain example embodiments, the method comprises:
providing an outer chamber surrounding the reaction chamber thereby closing an intermediate space in between the reaction chamber and the outer chamber.

In certain example embodiments, the intermediate space is heated. In certain example embodiments, at least one chemical flowing to the reaction space is heated (in the intermediate space or separately).

In certain example embodiments, the method comprises:
providing an outer chamber surrounding the reaction chamber thereby closing an intermediate space in between the reaction chamber and the outer chamber; and directing chemical in-feed tubes (the in-feed tubes having the inlets at the end of the in-feed tubes) via the intermediate space towards the reaction chamber.

In certain example embodiments, the method comprises:
providing the reaction space with symmetrical gas flow distribution.

In certain example embodiments, the method comprises:
maintaining fluid (or gas flow) dynamics in the reaction chamber unchanged when proceeding from one step to another step (e.g., from precursor pulse to purge) in a deposition cycle.

In certain example embodiments, a substrate holder is symmetrically placed in a laterally central area of the reaction chamber or reaction space. In certain example embodiments, an exhaust line is placed in a bottom section of the reaction chamber. In certain example embodiments, the exhaust line or gas removal causes an equal effect on gas flow everywhere around the substrate holder or substrate due to reasons of symmetry.

In certain example embodiments, the first precursor chemical is connected to more than one reaction chamber inlet (said lateral chemical inlet), with separate pulsing valves. The pulsing valves are separately (or individually) controlled or actuated by a control system. In certain example embodiments, also another precursor chemical is connected to more than one reaction chamber inlet. Also these inlets may be individually controlled by separate inlet valves.

In certain example embodiments, a single substrate is processed at a time in the reaction chamber. The substrate may be a wafer, such as a silicon wafer, with a diameter of 300 mm or 450 mm, for example.

In certain example embodiments, the method comprises providing a substrate or a plurality of substrates in the reaction space with sequential self-saturating surface reactions. In certain example embodiments, the method comprises performing temporal atomic layer deposition, in contrast to spatial ALD, without rotating the substrate. In certain example embodiments, the temporal atomic layer deposition is performed on the whole surface of the substrate at a time without dividing the substrate surface into multiple reaction zones. In certain example embodiments, the method comprises operating a hot wall reaction chamber. In certain example embodiments, the used deposition technology is chemical vapor deposition (CVD).

According to a second example aspect of the disclosed embodiments there is provided an apparatus, comprising:

a reaction chamber with a reaction space; and at least three lateral precursor chemical inlets pointing towards a centre area of the reaction space each from different directions, each of the at least three lateral precursor chemical inlets providing an individually closable route for a first precursor chemical to the reaction space.

In certain example embodiments, three of the pointing directions of the at least three inlets are mutually partly opposite.

In certain example embodiments, the number of inlets providing a closable route for a first precursor chemical to the reaction space is four, five, six, seven, eight, or nine inlets.

In certain example embodiments, at least three of the inlets are evenly distributed on a circumference symmetrically surrounding the centre area.

In certain example embodiments, the apparatus comprises:

a stationary substrate holder configured to carry a substrate; and a control system configured to open and close individual inlets in a predetermined manner to provide the substrate with an effect comparable to rotating the substrate.

In certain example embodiments, a chemical in-feed line of the first precursor chemical branches into a first, second and third in-feed tube extending to respective first, second and third lateral precursor chemical inlet that point towards the reaction space from said different directions. In certain example embodiments, the apparatus comprises an individually controlled pulsing valve in each of the first, second, and third in-feed tube.

In certain example embodiments, one precursor chemical in-feed line originating from a precursor chemical source (or container) is divided into a plurality of precursor chemical in-feed tubes, for example, 3 4, 5, 6, etc. in-feed tubes that lead into a plurality of lateral precursor chemical inlets. In certain example embodiments, each in-feed tube has its own pulsing valve. In certain example embodiments, each pulsing valve is pulsed (so that it passes the precursor chemical through) at a different time than the other pulsing valves.

In certain example embodiments, the apparatus comprises:

a heater configured to heat at least one chemical that flows into the reaction space.

In certain example embodiments, the apparatus comprises:

an outer chamber surrounding the reaction chamber thereby closing an intermediate space in between the reaction chamber and the outer chamber; and chemical in-feed tubes directed via the intermediate space towards the reaction chamber.

In certain example embodiments, the apparatus comprises:

a control system configured to maintain fluid dynamics in the reaction chamber unchanged when proceeding from one step to another step in a deposition cycle.

In certain example embodiments, each chemical in-feed tube carrying the same precursor chemical as at least one of the other chemical in-feed tubes has a separate pulsing valve, to release the precursor chemical or precursor vapor into the reaction chamber, as an ON/OFF pulse, or as a pulse to a carrier gas stream.

In certain example embodiments, the gas released from the lateral precursor chemical inlet(s) is reactive gas alone, in other embodiments, reactive gas mixed with carrier gas.

In certain example embodiments, the same in-feed tube feeds two or at least two precursor chemicals (reactive chemicals) into the reaction space. In certain example embodiments, two precursor chemicals originating from two separate precursor chemical sources (or containers) are fed into a plurality of (i.e., at least two or at least three) in-feed tubes each having its own pulsing valve, the in-feed tubes leading to respective lateral precursor chemical inlets.

In certain example embodiments, the apparatus comprises a hot wall reaction chamber. In certain example embodiments, the apparatus comprises a heated space sealed from ambient air on both sides of a reaction chamber wall.

According to a third example aspect of the disclosed embodiments there is provided a method, comprising:

providing a reaction chamber with a reaction space in a substrate processing apparatus; and providing two lateral precursor chemical inlets pointing towards a centre area of the reaction space from different directions, each lateral precursor chemical inlet providing an individually closable route for a first precursor chemical to the reaction space.

In certain example embodiments, the pointing directions of the two inlets are partly opposite or directly opposite to each other.

In certain example embodiments, the first precursor is released into the reaction space via a first lateral precursor chemical inlet, and subsequently during the same substrate processing sequence the same first precursor chemical is released into the reaction space via a different lateral precursor chemical inlet from another direction.

According to a fourth example aspect of the disclosed embodiments there is provided an apparatus, comprising:

a reaction chamber with a reaction space; and two lateral precursor chemical inlets pointing towards a centre area of the reaction space from different directions, each lateral precursor chemical inlet providing an individually closable route for a first precursor chemical to the reaction space.

In certain example embodiments, one precursor chemical in-feed line originating from a precursor chemical source (or container) is divided into two in-feed tubes one of which leads to a first inlet of the two lateral precursor chemical inlets and the other of which leads to a second inlet of the two lateral precursor chemical inlets. In certain example embodiments, both in-feed tubes have their own pulsing valve. In certain example embodiments, each pulsing valve is pulsed (so that it passes the precursor chemical through) at a different time than the other pulsing valve.

What is presented in connection with embodiments with at least three lateral precursor chemical inlets is also applicable to embodiments in which two lateral precursor chemical inlets are used.

Different non-binding example aspects and embodiments of the present disclosure have been illustrated in the foregoing. The above embodiments are used merely to explain selected aspects or steps that may be utilized in implementations of the present disclosure. Some embodiments may be presented only with reference to certain example aspects of the disclosed embodiments. It should be appreciated that corresponding embodiments apply to other example aspects as well. Any appropriate combinations of the embodiments may be formed.

BRIEF DESCRIPTION OF THE DRAWINGS

The aspects of the disclosed embodiments will now be described, by way of example only, with reference to the accompanying drawings, in which.

DETAILED DESCRIPTION

In the following description, Atomic Layer Deposition (ALD) technology is used as an example. However, the aspects of the disclosed embodiments are not limited to ALD technology, but it can be exploited in a wide variety of deposition apparatuses, for example, in Chemical Vapor Deposition (CVD) reactors.

The basics of an ALD growth mechanism are known to a skilled person. ALD is a special chemical deposition method based on the sequential introduction of at least two reactive precursor species to at least one substrate. It is to be understood, however, that one of these reactive precursors can be substituted by energy when using, for example, photo-enhanced ALD or plasma-assisted ALD, for example PEALD, leading to single precursor ALD processes. For example, deposition of a pure element, such as metal, requires only one precursor. Binary compounds, such as oxides can be created with one precursor chemical when the precursor chemical contains both of the elements of the binary material to be deposited. Thin films grown by ALD are dense, pinhole free and have uniform thickness.

The at least one substrate is typically exposed to temporally separated precursor pulses in a reaction vessel to deposit material on the substrate surfaces by sequential self-saturating surface reactions. In the context of this application, the term ALD comprises all applicable ALD based techniques and any equivalent or closely related technologies, such as, for example the following ALD sub-types: MLD (Molecular Layer Deposition) plasma-assisted ALD, for example PEALD (Plasma Enhanced Atomic Layer Deposition) and photo-enhanced Atomic Layer Deposition (known also as flash enhanced ALD).

A basic ALD deposition cycle consists of four sequential steps: pulse A, purge A, pulse B and purge B. Pulse A consists of a first precursor vapor and pulse B of another precursor vapor. Inactive gas and a vacuum pump are typically used for purging gaseous reaction by-products and the residual reactant molecules from the reaction space during purge A and purge B. A deposition sequence comprises at least one deposition cycle. Deposition cycles are repeated until the deposition sequence has produced a thin film or coating of desired thickness. Deposition cycles can also be either simpler or more complex. For example, the cycles can include three or more reactant vapor pulses separated by purging steps, or certain purge steps can be omitted. All these deposition cycles form a timed deposition sequence that is controlled by a logic unit or a microprocessor.

A reaction space is a defined volume within a reaction chamber. The desired chemical reactions occur in the reaction space. Basic ALD inlet tools through which chemicals are flown into the reaction space are generally knows as shower heads. The inlet of precursor chemical can be from the top, or cross flow, where the chemical is inlet from at least one side.

Figure 1:
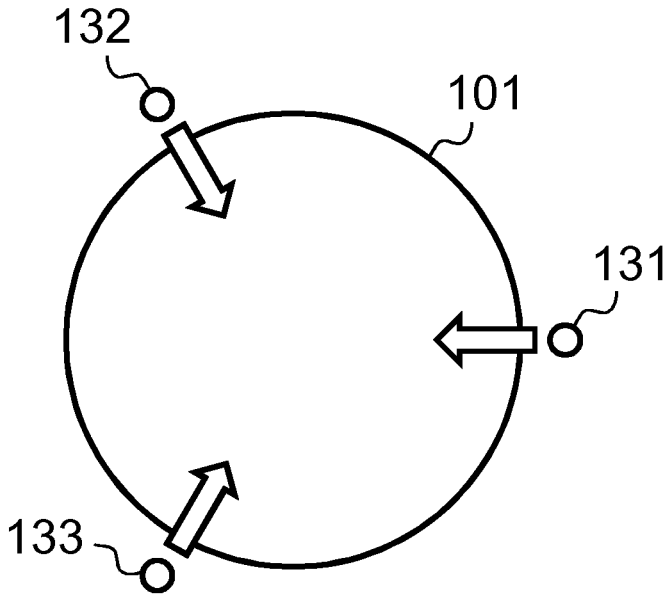
FIG. 1 shows a schematic drawing of providing lateral precursor chemical inlets in accordance with certain example embodiments of the present disclosure.

FIG. 1 shows a schematic drawing of providing lateral precursor chemical inlets in accordance with certain example embodiments of the present disclosure.

A substrate 101, which may be a wafer, such as a silicon wafer, is centrally positioned within a reaction space (not shown in FIG. 1).

Figures 3, 4:
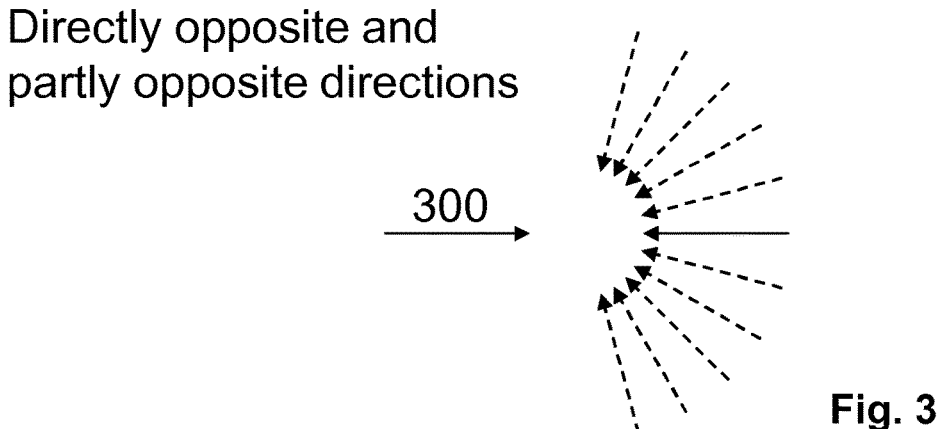
FIG. 3 shows directly opposite and partly opposite directions.
FIG. 4 shows a schematic side view of a substrate processing apparatus in accordance with certain example embodiments of the present disclosure.

Three lateral inlets 131, 132, and 133 have been positioned to point towards a centre area of the reaction space (and/or substrate 101) each from different directions. The pointing directions are mutually partly opposite. FIG. 3 shows directly opposite and partly opposite directions to a direction 300. The directions drawn by a dotted line represent directions that are partly opposite to the direction 300, whereas the direction drawn by a solid line represents the direction that is directly opposite to the direction 300. A direction that is partly opposite to direction 300 has both a component that is directly opposite to the direction 300 and a component that is perpendicular to the direction 300.

The inlets 131-133 in FIG. 1 are symmetrically placed with respect to the reaction space (and/or substrate 101). They are evenly distributed on a circumference symmetrically surrounding the centre area. Accordingly, the angular separation of the inlets 131-133 in FIG. 1 is 120 degrees.

A first precursor chemical is connected to each of the inlets 131-133. Each inlet 131, 132, and 133 provides a closable route for the first precursor chemical to the reaction space so that desired surface reactions can occur at the substrate surface.

The inlets are positioned at the end of corresponding in-feed tubes. In certain example embodiments, the first precursor chemical enters the reaction space via only one inlet at a time. Accordingly, during a first pulse period of the first precursor chemical, the first precursor chemical in certain example embodiments enters through a first inlet 131, and during a following pulse period of same precursor chemical, through a second inlet 132. Alternatively, during the first pulse period of the first precursor chemical, the first precursor chemical first enters through the first inlet 131, but during the same pulse period, the inlet of the first precursor chemical is switched to occur through the second inlet 132.

The first precursor chemical may be inlet into the reaction space together with a carrier gas, which typically is an inactive gas. In certain example embodiments, while the first precursor chemical enters the reaction space through one inlet 131-133 with or without the carrier gas, the carrier gas or inactive gas without the first precursor chemical flows into the reaction space through the remaining inlets 131-133.

Each of the inlets 131-133 can be controlled individually, for example by a separate pulsing valve (not shown in FIG. 1) positioned into the corresponding in-feed line. Individual control in certain example embodiments comprises controlling the flow rate and chemical composition of incoming fluid via each inlet 131-133 to improve uniformity of deposition. In certain example embodiments, the separate pulsing valves allow either the mixture of inactive carrier gas and first precursor chemical (or first precursor chemical alone, i.e., without carrier gas), or inactive carrier gas without the first precursor chemical to flow through a corresponding inlet into the reaction space at a time. In certain example embodiments, the reaction space is provided with symmetrical gas flow distribution around a vertical axis of symmetry.

As mentioned, a conventional ALD process contains repeated cycles of sequential pulses of precursor chemical A and B, such as trimethylaluminium (TMA) and water, typically separated by purge steps although in certain cases purge step(s) can be omitted. In a typical case, such as disclosed in U.S. Pat. No. 8,211,235 B1 each chemical is fed into the reaction chamber though its own in-feed tube. It is possible, however, to feed two precursor chemicals via same in-feed tube(s), but the deposition quality may thereby be decreased. However, the decrease in deposition quality may be avoided in deposition processes in which additional energy is used to promote surface reactions, such as in photo-enhanced or plasma enhanced deposition processes mentioned in the foregoing. Then the precursor chemicals can be selected so that they do not react with each other in an in-feed tube although they would be fed in through the same in-feed tube. The two (or more) precursor chemicals may be fed via one or more same in-feed tubes temporally separated or as a mixture.

Accordingly, in certain example embodiments, the separate pulsing valves allow at least two precursors as a mixture or temporally separated, with or without carrier gas to flow through a corresponding inlet into the reaction space at a time.

In certain example embodiments, the direction of precursor chemical flow is circulated from one inlet to the next inlet and so on thereby achieving the same spreading effect of precursor chemical that would be achieved by rotating the substrate 101.

Figure 2:
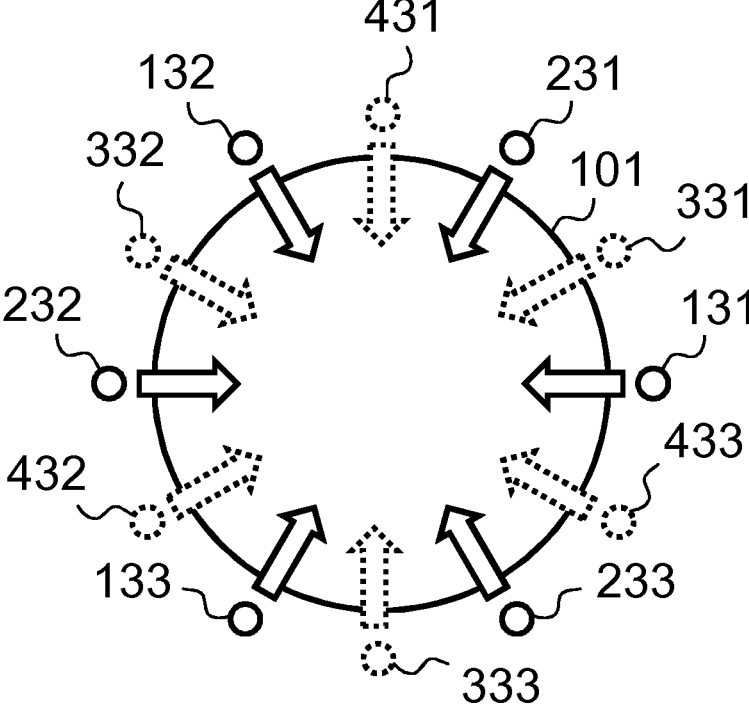
FIG. 2 shows a schematic drawing of providing further inlets in accordance with certain example embodiments of the present disclosure.

FIG. 1 only shows the inlets of the first precursor chemical although it is clear that depending on the process there may be one or more lateral inlets in addition to the inlets 131-133. FIG. 2 shows a more detailed configuration containing, in addition to the lateral (precursor) inlets 131-133, a plurality of other lateral inlets. Lateral inlets 231, 232, and 233 are similarly arranged with an angular separation of 120 degrees as inlets 131-133, but the position of the inlets 231-233 is rotated by 60 degrees so that their position in the above-mentioned circumference is half way in between the adjacent inlets of inlets 131-133. The circumference therefore comprises six inlets evenly distributed on the circumference. All inlets 131-133 and 231-233 are controlled individually. Which inlet is used to direct which chemical into the reaction space depends on the implementation. In an embodiment, inlets 131-133 are used to direct a first precursor chemical into the reaction space during a first pulse period, inlet 232 which is directly opposite to inlet 131 to direct a second precursor chemical during a second pulse period, and inlets 231 and 233 to direct purge gas continuously into the reaction space. When there is no precursor chemical inlet into the reaction space via precursor chemical inlets 131-133, and 231 there may be inactive gas flowing into the reaction space through these inlets.

FIG. 2 further shows optional lateral inlets 331, 332, and 333 as well as optional lateral inlets 431, 432, and 433. The inlets 331-333 and 431-433 are similarly arranged with an angular separation of 120 degrees as inlets 131-133, but the position of the inlets 331-333 is rotated by 30 degrees and the position of the inlets 431-433 by 90 degrees so that the circumference comprises twelve evenly distributed inlets. All inlets 131-133, 231-233, 331-333, and 431-433 are controlled individually (for example by a separate pulsing valve actuated by a control system). Which inlet is used to direct which chemical into the reaction space depends on the implementation. The inlets may be used to direct a first or a second precursor chemical, or purge gas. In certain example embodiments, the number of inlets providing a closable route for a first precursor chemical to the reaction space is three, four, five, six, seven, eight, or nine inlets to provide more uniform distribution of precursor chemical on the substrate surface.

In certain example embodiments, the pointing directions of three of the inlets connected to the first precursor chemical are mutually partly opposite. This means that the pointing direction of any first inlet is partly opposite to both pointing directions of the other two inlets. In certain other embodiments, the inlets connected to the first precursor chemical are arranged differently. They need not be evenly distributed. For example, in certain example embodiments the pointing directions of three of the inlets connected to the first precursor chemical are such that two of the pointing directions are directly opposite to each other and the pointing direction of the remaining inlet is perpendicular to both pointing directions. In certain example embodiments, at least three of the inlets connected to the first precursor chemical point towards a centre area of the reaction space each from different directions, but all pointing directions need not be mutually partly nor directly opposite. In certain example embodiments, the inlets connected to the first precursor chemical are distributed on the circumference surrounding the centre area of the reaction space such that the reaction space is divided into 360/n equal sectors (where n=120, 90, 72, 60, 45, 40, 36, or 30, for example, i.e., the number of sectors, respectively, is 3, 4, 5, 6, 8, 9, 10, or 12) such that each sector contains at least one inlet connected to the first precursor chemical. In certain example embodiments, an inlet is implemented by an inlet group comprising a plurality of individual inlets at the same position next to each other.

FIG. 4 shows a schematic side view of a substrate processing apparatus 100 in accordance with certain example embodiments of the present disclosure. The substrate processing apparatus 100, in certain example embodiments, is a deposition apparatus, a deposition reactor, for example an ALD or CVD reactor.

The apparatus 100 comprises a reaction chamber 110 that defines a reaction space 111. In certain example embodiments, the apparatus comprises an outer chamber 120 surrounding the reaction chamber 110 thereby closing an intermediate space 121 in between the reaction chamber 110 and the outer chamber 120. In certain example embodiments, the intermediate space 121 is heated by a heater 145 positioned in the space 121.

In certain example embodiments, the reaction space 111 is in the general form of a cylinder. In certain example embodiments, the reaction space 111 has a circular cross section. In certain other example embodiments, the reaction space is in the general form of a rectangle. In certain example embodiments, the reaction space has a square cross section. In certain example embodiments, a stationary (i.e., non-rotatable) substrate holder 102 is centrally positioned within the reaction space. In certain example embodiments, the substrate holder carries a substrate 101, or a plurality of substrates in certain example embodiments. The substrate 101 may be in the form disclosed in connection with FIGS. 1 and 2, i.e., a wafer.

In certain other example embodiments, there are multiple wafers horizontally arranged on top of each other so that gases can flow in between of them in a horizontal direction. In certain other example embodiments, there is a single wafer vertically positioned or there are multiple wafers vertically arranged in parallel to each other so that gases can flow in between of them.

In certain example embodiments, the reaction chamber 110 is sealed from the top by a reaction chamber lid 113. In other embodiments, such as the one shown in FIG. 5, the lid may be omitted. The lid 113 in certain example embodiments is a movable lid which is vertically movable by an elevator to provide a loading and unloading opening. The elevator is represented in FIG. 4 by an arrow 480. The loading performed in certain example embodiments via a loading port 114 or similar positioned in a sidewall of the outer chamber 120.

The substrate holder 102 is in certain example embodiments attached, or integrated, to the lid 113 (although this is not shown in FIG. 4). In other embodiments, the substrate holder is supported from below (also not shown in FIG. 4).

The apparatus 100 comprises at least three lateral precursor chemical inlets pointing towards a centre area of the reaction space 111 each from different directions, each of the at least three lateral chemical inlets providing a closable route for a first precursor chemical to the reaction space 111. The number and positioning of the inlets may be, for example, the same as shown in any of the alternatives shown in connection with FIGS. 1 and 2 although only a single inlet 131 is shown in FIG. 4.

In certain example embodiments, the first precursor chemical is connected from a precursor source to more than one reaction chamber inlet (said lateral precursor chemical inlet), with separate pulsing valves. The pulsing valves are separately (or individually) controlled by a control system 160, and they are positioned on the outside of the reaction chamber 110. The control system 160 comprises a processor configured to execute a computer program stored at a memory medium. In certain example embodiments, the control system 160 is configured, as instructed by the computer program, to send control signals to the pulsing valves or pulsing valve actuation members so as to open and close desired inputs and output(s) of the pulsing valves.

FIG. 4 shows the lateral precursor chemical inlet 131 positioned at the end of a corresponding in-feed tube 141. A first branch 141*a* of the in-feed tube 141 is in fluid communication with a source 151 of the first precursor chemical. A second branch 141*b* of the in-feed tube 141 is in fluid communication with an inactive or carrier gas source 152. In certain example embodiments, the first precursor chemical or a mixture of first precursor chemical and carrier gas flows along the first branch 141*a* to a first inlet of a pulsing valve 142. The positioning of the pulsing valve 142 depends on the implementation. If the outer chamber 120 is present the pulsing valve 142 may be positioned on the outside of the outer chamber 120. Inactive or carrier gas flows along the second branch 141*b* to a second inlet of the pulsing valve 142. The control system 160 controls the pulsing valve 142 so that either precursor vapor (or mixture of precursor vapor and carrier gas) or inactive gas flows via an outlet of the pulsing valve 142 along the in-feed tube 141 to the inlet 131 and therefrom into the reaction space 111.

In certain example embodiments, the gas flow rate from all inlets into the reaction space is kept unchanged when proceeding from one step to another step (e.g., from precursor pulse to purge) in a deposition cycle.

In certain example embodiments, also another chemical is connected to more than one reaction chamber inlet. Also these inlets may be individually controlled by separate inlet or pulsing valves. As mentioned, there may be more than one precursor chemical. In certain example embodiments, at least one chemical, e.g., precursor chemical, flowing to the reaction space 111 is heated (in the intermediate space 121, for example, by the heater 145, or separately).

In certain example embodiments, there is provided an incoming flow of the first precursor chemical onto substrate surface from sides of the reaction chamber 110, and an outgoing flow downwards to an exhaust line 115, or foreline, after passing an edge of the substrate 101. In certain example embodiments, the exhaust line 115 is positioned below the substrate 101.

In certain example embodiments, the chemical inlets and optionally in-feed tubes are extended into the inside of the lid 113 (see FIG. 5) over the substrate, similarly as described in U.S. Pat. No. 8,211,235 B1.

In certain example embodiments, the apparatus comprises pulsing valves required to separate inlets 131, 132, and 133, for example, attached to the lid 113.

In certain example embodiments, as also shown in FIG. 4, a substrate holder 102 is symmetrically placed with respect to a vertical axes of symmetry in a central area of the reaction chamber 110 or reaction space 111. In certain example embodiments, the exhaust line 115 is placed in a bottom section of the reaction chamber 110. In certain example embodiments, the exhaust line 115 or gas removal causes an equal effect on gas flow everywhere around the substrate holder 102 or substrate 101 due to reasons of symmetry.

Figures 5, 6:
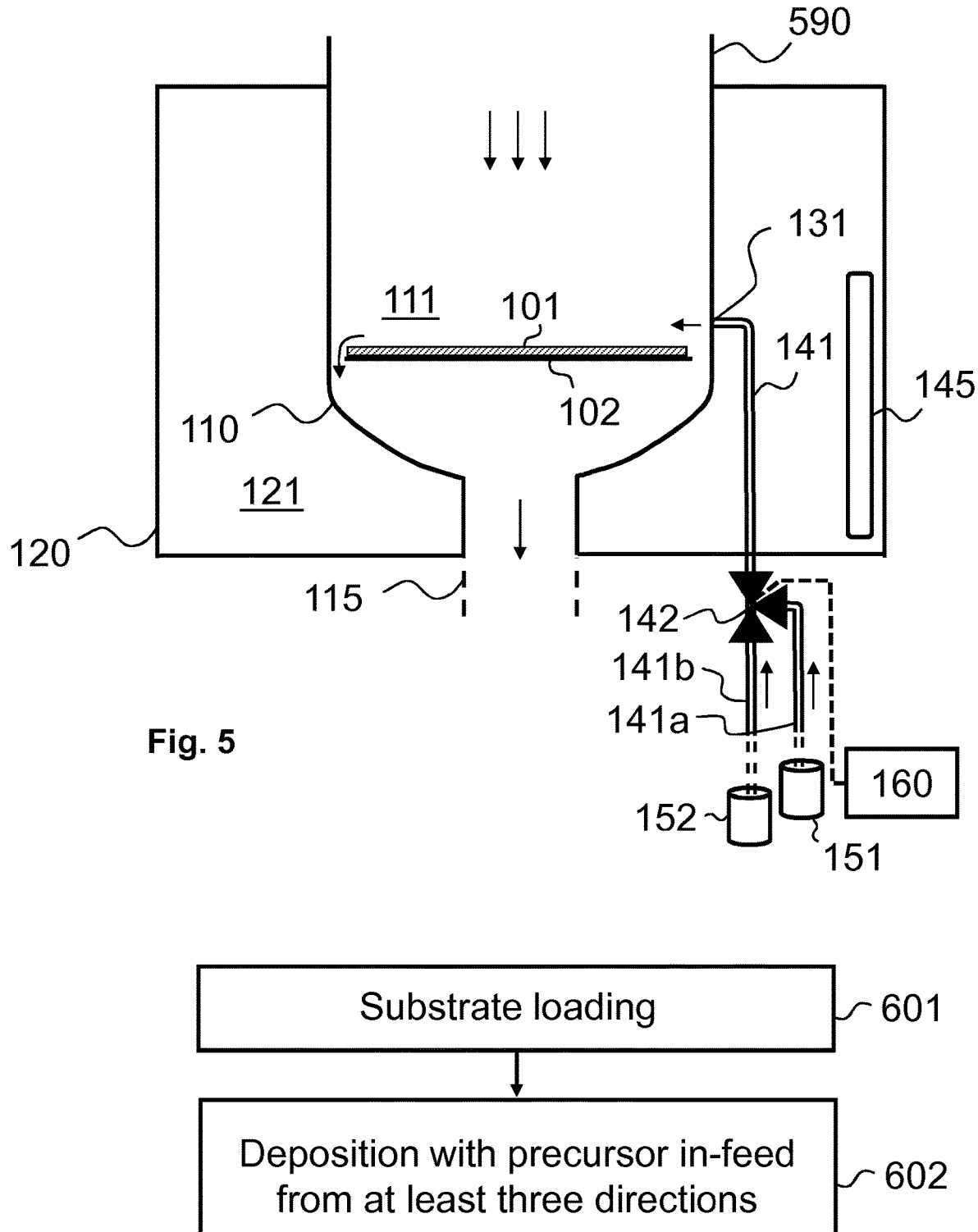
FIG. 5 shows a schematic side view of a substrate processing apparatus in accordance with certain other example embodiments of the present disclosure.
FIG. 6 shows a flow chart of a method in accordance with certain example embodiments of the present disclosure.

FIG. 5 shows a schematic side view of a substrate processing apparatus, such as a deposition or cleaning apparatus, in accordance with certain other example embodiments of the present disclosure. What is shown in FIG. 5 differs from what is shown in FIG. 4 in that the apparatus shown in FIG. 5 comprises a top in-feed part 590 in addition to the reaction chamber inlets 131, etc. on the side. The top in-feed part 590 in certain example embodiments is used to feed in energy into the reaction space 111 in the form of plasma radicals or photons, for example, to promote surface reactions on the substrate surface, for example, in accordance with PEALD, or photo-enhanced ALD. Otherwise the description presented in connection with FIG. 4 can be applied to the embodiments illustrated in FIG. 5. What has been described in connection with FIGS. 1-3 is also applicable to the embodiments shown in FIGS. 4 and 5. This applies both to the described structures and operation.

FIG. 6 shows a flow chart of a method in accordance with certain example embodiments of the present disclosure. In step 601, a substrate is loaded into the reaction chamber via a loading route. In an example embodiment as shown in FIG. 4, the loading occurs, for example, via the loading port 114 and via the route formed by lifting the lid 113. In an example embodiment as shown in FIG. 5, the loading occurs, for example, via a similar loading port and via a route formed by lowering the chamber similarly as described in a co-pending patent application PCT/FI2017/050071 filed by the same applicant. In step 602, an ALD deposition sequence is performed in which a first precursor chemical flows into the reaction chamber, or reaction space, from at least three lateral directions such that the first precursor chemical flows only from one direction at a time. After deposition, in step 603 the substrate is unloaded from the reaction chamber.

When ALD chemicals (such as a first or second precursor chemical, carrier or purge gas) are released to the reaction chamber in gas phase, the preferred flow pattern may depend on the chemical, and process conditions. In certain example embodiments, commencement of a precursor pulse period does not change the fluid dynamics in the reaction space. This may be desirable when the pressure range generally >0.1 mbar is used within the reaction chamber and the flow within the reaction space is turbulent. In certain other example embodiments, the fluid dynamics upon commencement or during a precursor pulse period is intentionally changed. This may be desirable, for example, when pressures <1 mbar, down to 1 µbar are used within the reaction chamber and the flow of a pulsed chemical within the reaction space is required to be more laminar. The fluid dynamics is changed, in certain example embodiments, by decreasing the flow rate of one or more inlets other than the inlet releasing the pulsed chemical (i.e., first or second precursor chemical). The pulsed chemical reaches a larger area on the substrate surface compared to the situation in which the fluid dynamics is not changed, and the pulsed chemical in certain example embodiments flows over the substrate as a laminar flow not creating turbulence or rotation over the substrate.

In certain example embodiments, the flow rate of each inlet is controlled by a mass flow controller positioned in each in-feed tube. In certain example embodiments, the flow rate of inlets other than the pulsing inlet in question is varied between a plurality of predefined values. For example, all other inlets may have the flow rate of 50 sccm during purge steps, 40 sccm during a first pulse of a first precursor chemical from one direction, and 20 sccm during a second pulse of the same chemical. In certain example embodiments, the same chemical is be pulsed from multiple directions (but from one direction at a time) while the flow rate of other inlets remains unchanged. Alternatively, the flow rate of the other inlets is changed before the change of the pulsed chemical from one direction to another direction.

In certain example embodiments, different chemicals (herein denoted as precursor chemicals A and B) are fed in into the reaction chamber (reaction space) each from different inlets. However, as described in the published patent application WO2016102748 (A1) filed by the same applicant, precursor chemical B can be a carrier of precursor chemical A when the energy is fed in by photons or otherwise from the top in an arrangement similar to that shown in FIG. 5. In this arrangement, one, two, three or more inlets can be common to both precursor chemical A and B without having the unwanted chemical reactions between precursor chemicals A and B in the chemical in-feed tubes.

Further, different chemicals have different reactivity, for example. In certain example embodiments, all precursor chemicals need not be pulsed from a plurality of directions. For example, with 4 inlets it is possible to realise a solution where precursor chemical A is pulsed from three directions, and precursor chemical B only from one remaining direction.

In certain example embodiments, at least the inlets of one precursor chemical are divided with an equal division along the horizontal perimeter of the reaction chamber or reaction space. In certain example embodiments, there are six lateral inlets on the perimeter three of which are used to pulse precursor chemical A (first precursor chemical) and the remaining three to pulse precursor chemical B (second precursor chemical). In terms of FIG. 2, the inlets 131-133 may be used to release precursor chemical A into the reaction space and the inlets 231-233 to release precursor chemical B into the reaction space. In certain example embodiments, when there is no precursor chemical pulsing via the inlet concerned, there is inactive (or purge) gas flow via that inlet towards the reaction space.

The description concerning any particular preceding embodiment is directly applicable to other disclosed embodiments. This applies both with regard to the structure and operation of the disclosed apparatus. The teachings that have been described in the preceding in connection with the pulsing operation of precursor chemical(s) can similarly be applied to purging operations within the disclosed apparatus.

Without limiting the scope and interpretation of the patent claims, certain technical effects of one or more of the example embodiments disclosed herein are listed in the following. A technical effect is improvement in the uniformity of ALD deposition when processing large substrates compared to single inlet solutions. Another technical effect is delivery of high quantities of the gas phase chemical to a substrate compared to a single inlet solutions. Another technical effect is providing a similar effect than when rotating the substrate by circulating the direction from which precursor chemical is released into the reaction chamber or reaction space instead.

While the conventional approach has been to rotate the substrate in order to reduce the non-uniformity, the presented embodiments of the present disclosure provide counterintuitive approach of having additional chemical inlets with valves to the reaction chamber. The presented solution may provide the same benefits in improving uniformity without significantly more expensive tool construction and without added particles (as in case of rotating the substrate itself). Further, if the substrate is, for example, a 3D object, the gas flows do not change similarly in embodiments of the presented solution, as they would likely change when a 3D substrate would be rotated in a spatial ALD chamber, for example.

It should be noted that some of the functions or method steps discussed in the preceding may be performed in a different order and/or concurrently with each other. Furthermore, one or more of the above-described functions or method steps may be optional or may be combined.

The foregoing description has provided by way of non-limiting examples of particular implementations and embodiments of the present disclosure a full and informative description of the best mode presently contemplated by the inventors for carrying out the aspects of the disclosed embodiments. It is however clear to a person skilled in the art that the present disclosure is not restricted to details of the embodiments presented above, but that it can be implemented in other embodiments using equivalent means without deviating from the characteristics of the present disclosure.

Furthermore, some of the features of the above-disclosed embodiments of the present disclosure may be used to advantage without the corresponding use of other features. As such, the foregoing description should be considered as merely illustrative of the principles of the present disclosure, and not in limitation thereof. Hence, the scope of the present disclosure is only restricted by the appended patent claims.

The invention claimed is:
1. A method, comprising:
providing a reaction chamber with a reaction space in a substrate processing apparatus;

providing a non-rotatable substrate holder configured to carry a substrate;

providing at least three lateral precursor chemical inlets pointing towards a centre area of the reaction space each from different directions, each of the at least three lateral precursor chemical inlets providing an individually closable route for a first precursor chemical to the reaction space; and providing respective in-feed tubes extending to respective ones of the precursor chemical inlets, which are individually closable, said individually closable precursor chemical inlets being configured to discharge the first precursor chemical into the reaction space from sides of the reaction chamber.

2. The method of claim 1, comprising:

providing a substrate in the reaction space with sequential self-saturating surface reactions.

3. The method of claim 1, where three of the pointing directions of the at least three lateral precursor chemical inlets are mutually partly opposite.

4. The method of claim 1, where the number of lateral precursor chemical inlets providing an individually closable route for a first precursor chemical to the reaction space is four, five, six, seven, eight, or nine inlets.

5. The method of claim 1, where at least three of the lateral precursor chemical inlets are evenly distributed on a circumference symmetrically surrounding the centre area.

6. The method of claim 1, where the first precursor chemical is pulsed into the reaction space from one direction at a time.

7. The method of claim 6, where the pulsing direction is changed during a pulse period or between consecutive pulse periods of the same precursor chemical.

8. The method of claim 1, comprising:

carrying a substrate by the non-rotatable substrate holder; and providing the substrate with an effect comparable to rotating the substrate by opening and closing the at least three individual lateral precursor chemical inlets in a predetermined manner.

9. The method of claim 1, comprising:

providing an incoming flow of the first precursor chemical onto a substrate surface from sides of the reaction chamber, and an outgoing flow downwards to exhaust after passing an edge of the substrate.

10. The method of claim 1, comprising:

heating at least one chemical that flows into the reaction space.

11. The method of claim 1, comprising:

providing an outer chamber surrounding the reaction chamber thereby closing an intermediate space in between the reaction chamber and the outer chamber; and directing the in-feed tubes via the intermediate space towards the reaction chamber.

12. The method of claim 1, comprising:

providing the reaction space with symmetrical gas flow distribution.

13. The method of claim 1, comprising:

maintaining fluid dynamics in the reaction chamber unchanged when proceeding from one step to another step in a deposition cycle.

14. An apparatus, comprising:

a reaction chamber with a reaction space;

a non-rotatable substrate holder configured to carry a substrate; and at least three lateral precursor chemical inlets pointing towards a centre area of the reaction space each from different directions, each of the at least three lateral precursor chemical inlets providing an individually closable route for a first precursor chemical to the reaction space, the apparatus comprising respective in-feed tubes extending to respective ones of the precursor chemical inlets, which are individually closable, said individually closable precursor chemical inlets being configured to discharge the first precursor chemical into the reaction space from sides of the reaction chamber.

15. The apparatus of claim 14, where three of the pointing directions of the at least three lateral precursor inlets are mutually partly opposite.

16. The apparatus of claim 14, where the number of lateral precursor inlets providing a closable route for the first precursor chemical to the reaction space is four, five, six, seven, eight, or nine inlets.

17. The apparatus of claim 14, where at least three of the lateral precursor inlets are evenly distributed on a circumference symmetrically surrounding the centre area.

18. The apparatus of claim 14, wherein the non-rotatable substrate holder is stationary, the apparatus comprising:

a control system configured to open and close the at least three individual lateral precursor inlets in a predetermined manner to provide the substrate with an effect comparable to rotating the substrate.

19. The apparatus of claim 14, wherein a chemical in-feed line of the first precursor chemical branches into a first, second and third in-feed tube of the respective in-feed tubes extending to respective first, second and third lateral precursor chemical inlets of the at least three lateral precursor chemical inlets that point towards the reaction space from said different directions.

20. The apparatus of claim 19, comprising an individually controlled pulsing valve in each of the first, second, and third in-feed tube of the respective in-feed tubes.

21. The apparatus of claim 14, comprising:

a heater configured to heat at least one chemical that flows into the reaction space.

22. The apparatus of claim 14, comprising:

an outer chamber surrounding the reaction chamber thereby closing an intermediate space in between the reaction chamber and the outer chamber; and first, second, and third chemical in-feed tube of the respective in-feed tubes directed via the intermediate space towards the reaction chamber.

23. The apparatus of claim 14, comprising:

a control system configured to maintain fluid dynamics in the reaction chamber unchanged when proceeding from one step to another step in a deposition cycle.

24. The apparatus of claim 14, wherein said at least three lateral precursor chemical inlets point towards a vertical centreline of the reaction space each from different directions.

25. The apparatus of claim 14, wherein the reaction space is of the general form of a cylinder.

26. The apparatus of claim 14, wherein said at least three lateral precursor chemical inlets each have a pointing direction with a lateral component pointing towards the centre area of the reaction space.

27. The apparatus of claim 14, configured to provide an effect comparable to virtually rotating the substrate.

* * * * *